(12) United States Patent
Nakai et al.

(10) Patent No.: US 8,094,483 B2
(45) Date of Patent: Jan. 10, 2012

(54) SEMICONDUCTOR DEVICE INCLUDING BIT LINE GROUPS

(75) Inventors: Kiyoshi Nakai, Tokyo (JP); Shuichi Tsukada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 178 days.

(21) Appl. No.: 12/628,835

(22) Filed: Dec. 1, 2009

(65) Prior Publication Data

US 2010/0135063 A1 Jun. 3, 2010

(30) Foreign Application Priority Data

Dec. 1, 2008 (JP) ................................. 2008-306130

(51) Int. Cl.
*G11C 11/00* (2006.01)
*G11C 7/00* (2006.01)
(52) U.S. Cl. ....................................... 365/148; 365/163
(58) Field of Classification Search .................. 365/148, 365/163, 189.04
See application file for complete search history.

(56) References Cited

U.S. PATENT DOCUMENTS

| 6,778,445 B2 * | 8/2004 | Ooishi et al. ............. 365/189.19 |
| 7,283,407 B2 * | 10/2007 | Inoue et al. .............. 365/189.11 |
| 7,463,536 B2 * | 12/2008 | Scheuerlein et al. .... 365/189.18 |
| 7,830,699 B2 * | 11/2010 | Choi et al. .................... 365/148 |

FOREIGN PATENT DOCUMENTS

JP  2008-71384  3/2008

* cited by examiner

*Primary Examiner* — Anh Phung
(74) *Attorney, Agent, or Firm* — Morrison & Foerster LLP (57) ABSTRACT

A semiconductor device includes: a first read/write amplifier; a second read/write amplifier; a first group of bit lines belonging to the first read/write amplifier; a second group of bit lines belonging to the second read/write amplifier and mixed with the first group of bit lines. One of the first group of bit lines and one of the second group of bit lines are selected in parallel. A reference potential is supplied to at least one of the first non-selected bit lines adjacent to the first selected bit line selected from the first group of bit lines, and to at least one of the second non-selected bit lines adjacent to the second selected bit line selected from the first group of bit lines. At least one of remaining ones of the first and second non-selected bit lines is set into a floating state.

17 Claims, 6 Drawing Sheets

SEMICONDUCTOR DEVICE INCLUDING BIT LINE GROUPS

This application is based upon and claims the benefit of priority from Japanese Patent Application No. 2008-306130 filed in Japan Patent Office on Dec. 1, 2008, the contents of which are hereby incorporated by reference.

BACKGROUND OF THE INVENTION (1) Field of the Invention

The present invention relates to a semiconductor device, and specifically relates to a semiconductor memory including hierarchized bit lines.

(2) Description of Related Art

The art related to the present invention includes a semiconductor memory device disclosed in Japanese Patent Laid-Open No. 2008-71384. In this semiconductor memory device, a plurality of bit lines are provided for one read/write amplifier, and a bit line selected from those bit lines is electrically connected to the read/write amplifier.

The present inventors have found that semiconductor memory devices such as disclosed in Japanese Patent Laid-Open No. 2008-71384 cause the following problems.

When a non-selected bit line adjacent to a selected bit line is in a floating state, noise is introduced to the floating non-selected bit line via word lines or the substrate, and the noise introduced to the non-selected bit line may affect the selected bit line. In order to reduce the effect of such noise, normally, non-selected bit lines are clamped (fixed) to a reference potential (normally, ground potential).

For clamping means, a technique in which, for example, an NMOS transistor is provided between each bit line and a reference potential, and the on/off of this NMOS transistor is controlled using the inverted level of a corresponding bit line selection signal may be employed. However, such fixing means requires provision of an inverter for inverting the level of a bit line selection signal to each bit line, resulting in an increase in the number of components constituting the circuit.

SUMMARY

In one embodiment, there is a semiconductor device that includes: a first read/write amplifier; a second read/write amplifier; a first group of bit lines belonging to the first read/write amplifier; a second group of bit lines belonging to the second read/write amplifier and mixed with the first group of bit lines; a selection circuit designating one of the first group of bit lines and one of the second group of bit lines respectively to a first selected bit line and a second selected bit line in parallel to each other while designating remaining ones of the first group of bit lines and remaining ones of the second group of bit lines respectively to first non-selected bit lines and second non-selected bit lines, and a control circuit supplying a reference potential to at least one of the first non-selected bit lines, which is adjacent to the first selected bit line, and to at least one of the second non-selected bit lines, which is adjacent to the second selected bit line, and bringing at least one of remaining ones of the first and second non-selected bit lines into a floating state.

According to the above bit line control configuration, a bit line adjacent to a selected bit line is clamped to a reference potential, and thus, it is possible to suppress noise from word lines or the substrate that affects a selected bit line via non-selected bit lines.

Also, the above bit line control configuration cannot be provided by a circuit provided with an inverter for each bit line. The above bit line control configuration can be provided by, for example, a circuit such as one in which column selection signals for controlling the column switches provided for the respective bit lines are ORed or NORed, and the bit lines are clamped based on the OR or NOR. Such a circuit has a smaller number of components compared to a circuit provided with an inverter for each bit line.

In another embodiment, there is a semiconductor device that includes: a plurality of first bit lines; a plurality of second bit lines mixed with the first bit lines; a first read/write amplifier; a second read/write amplifier; a plurality of first column switches each provided between a corresponding one of the first bit lines and the first read/write amplifier, one of the first column switches being rendered conductive in response to a set of column selection signals to electrically connect an associated one of the first bit lines to the first read/write amplifier as a first selected bit line; a plurality of second column switches each provided between a corresponding one of the second bit lines and the second read/write amplifier, one of the second column switches being rendered conductive in response to the set of column selection signals to electrically connect an associated one of the second bit lines to the second read/write amplifier as a second selected bit line; a plurality of bit line control switches each connected between a corresponding one of the first and second bit lines and a reference potential point; and a logic gate responding to a part of the set of column selection signals other than a remaining part of the column selection signals and rendering a part of the bit line control switches conductive while keeping a remaining part of the bit line control switches nonconductive.

With the above configuration, also, as with the aforementioned semiconductor memory, it is possible to suppress noise affecting a selected bit line, and to reduce the number of components of the circuit, compared to a circuit provided with an inverter for each bit line.

The present invention enables provision of a highly-stable, low-cost semiconductor memory that enables noise suppression.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
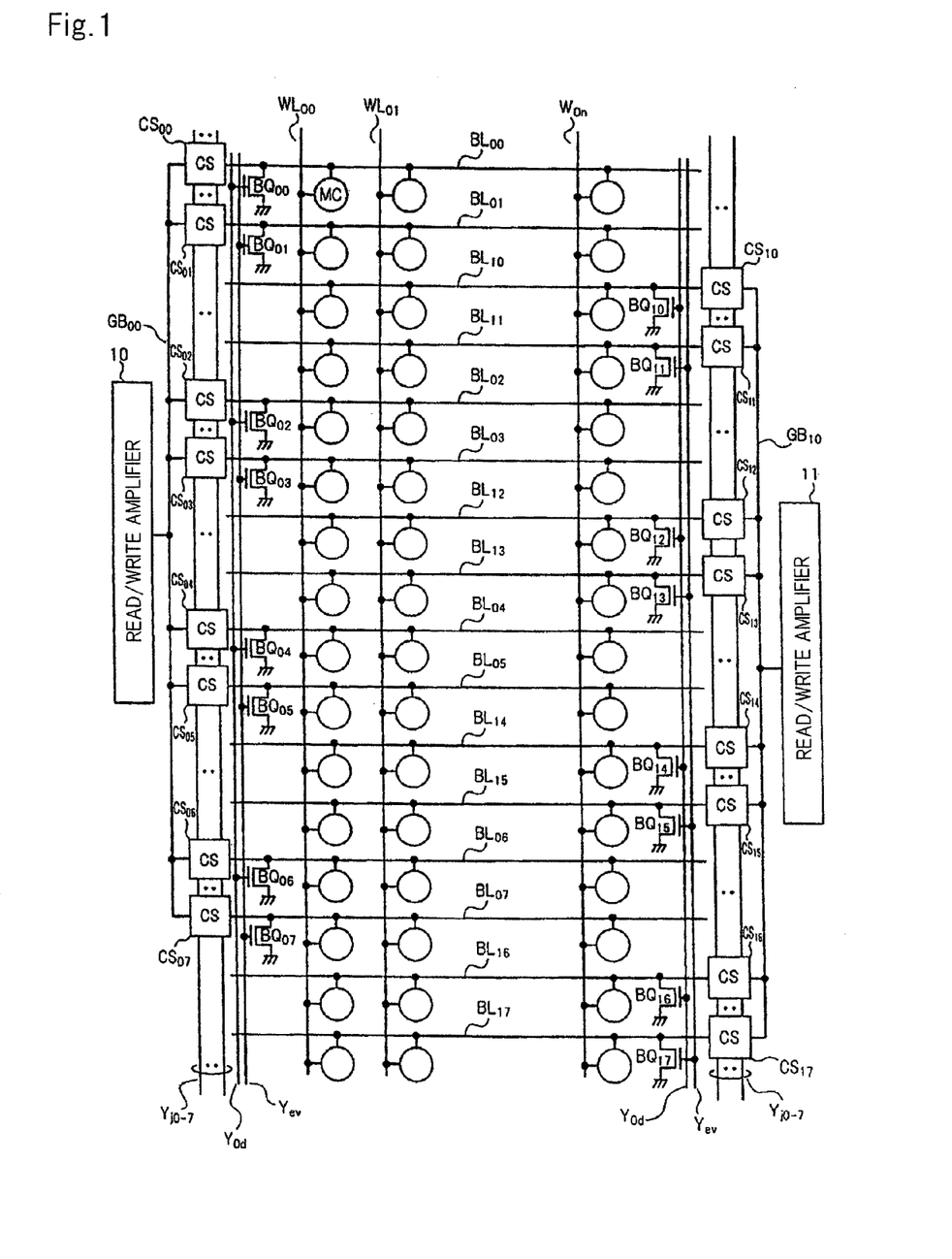
FIG. 1 is a block diagram illustrating a configuration of a main part of a semiconductor memory according to a first embodiment of the present invention.

Referring now to FIG. 1, a semiconductor device according to a first embodiment of the present invention includes: a plurality of word lines $WL_{00}$ to $WL_{0n}$ arranged in parallel, a plurality of bit lines $BL_{00}$ to $BL_{07}$ and $BL_{10}$ to $BL_{17}$ arranged in parallel in such a manner that they intersect with word lines $WL_{00}$ to $WL_{0n}$; and a plurality of memory cells MC arranged in the respective intersections of word lines $WL_{00}$ to $WL_{0n}$ and bit lines $BL_{00}$ to $BL_{07}$ and $BL_{10}$ to $BL_{17}$.

Bit lines $BL_{00}$ to $BL_{07}$ are connected to read/write amplifier 10 via column switches $CS_{00}$ to $CS_{07}$. Bit lines $BL_{10}$ to $BL_{17}$ are connected to read/write amplifier 11 via column switches $CS_{10}$ to $CS_{17}$. Read/write amplifiers 10 and 11 are arranged on opposite sides of a memory cell array part in which the plurality of memory cells MC are arranged in a matrix.

Bit lines $BL_{00}$ to $BL_{07}$ and bit lines $BL_{10}$ to $BL_{17}$ are arranged two by two alternately. In other words, they are arranged in the following order from one side: bit lines $BL_{00}$ and $BL_{01}$, bit lines $BL_{10}$ and $BL_{11}$, bit lines $BL_{02}$ and $BL_{03}$, bit lines $BL_{12}$ and $BL_{13}$, bit lines $BL_{04}$ and $BL_{05}$, bit lines $BL_{14}$ and $BL_{15}$, bit lines $BL_{06}$ and $BL_{07}$, and bit lines $BL_{16}$ and $BL_{17}$.

Memory cell MC includes a resistive element whose resistance value varies according to stored data, and whose current following therein is different in a selected state. Examples of such resistive element include phase-change elements. A phase-change element changes from a crystalline state to an amorphous state and vice versa (phase change). Normally, a crystalline state exhibits a resistance value lower than an amorphous state. Examples of such phase-change element include those using a GST (GeSbTe) alloy.

Figure 2:
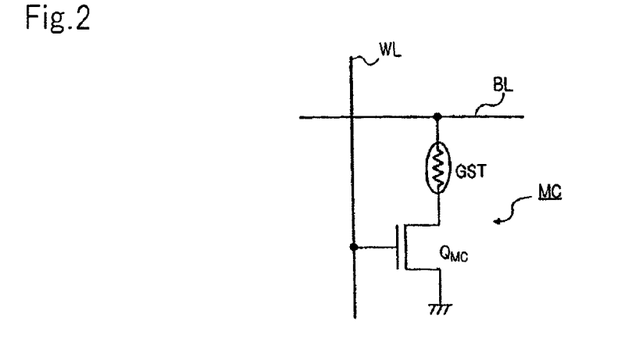
FIG. 2 is a circuit diagram illustrating an example of memory cell MC using a phase-change element.

FIG. 2 illustrates an example of memory cell MC using a phase-change element. Memory cell MC includes phase-change element GST and NMOS transistor $Q_{MC}$. One of two terminals corresponding to the source and drain of NMOS transistor $Q_{MC}$ is connected to bit line BL via phase-change element GST, and the other terminal is connected to a grounding line. The gate of NMOS transistor $Q_{MC}$ is connected to word line WL. When word line WL becomes an active level, NMOS transistor $Q_{MC}$ becomes conductive, electrically connecting the bit line to the grounding line.

For memory cell MC, other than the above structure, an element that stores "1" or "0" using the difference in threshold voltages of a transistor, such as flash memory, can be used.

Referring again to FIG. 1, each of column switch $CS_{00}$ to $CS_{07}$ and $CS_{10}$ to $CS_{17}$ becomes conductive when a corresponding selection signal from eight column selection signal lines $Y_{j0}$ to $Y_{j7}$ exhibits an active level.

Figure 3:
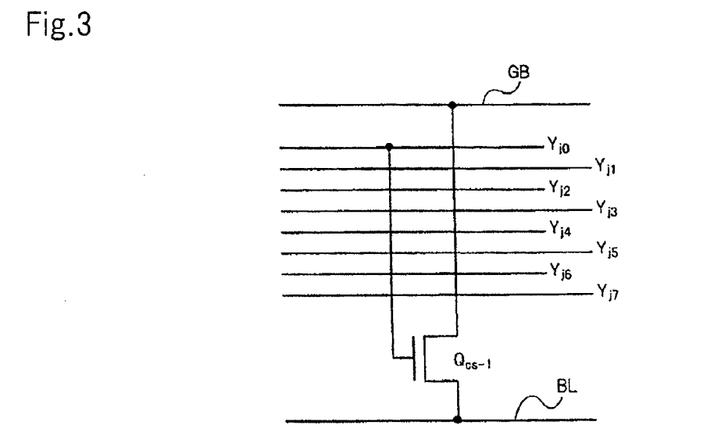
FIG. 3 is a circuit diagram illustrating an example of a column switch.

FIG. 3 illustrates an example of a column switch. This column switch includes NMOS transistor $Q_{CS-1}$. One of two terminals corresponding to the source and drain of NMOS transistor $Q_{CS-1}$ is connected to global bit line GB, and the other terminal is connected to bit line BL. Global bit line GB is a global bit line connected to this column switch, from among global bit lines $GB_{00}$ and $GB_{10}$. Bit line BL is a bit line connected to this column switch, from among bit lines $BL_{00}$ to $BL_{07}$ and $BL_{10}$ to $BL_{17}$.

The gate of NMOS transistor $Q_{CS-1}$ is connected to a corresponding selection signal line from among column selection signal lines $Y_{j0}$ to $Y_{j7}$. In the example illustrated in FIG. 3, the gate of NMOS transistor $Q_{CS-1}$ is connected to column selection signal line $Y_{j0}$. This is an example of connection when the column switch illustrated in FIG. 3 is applied to column switches $CS_{00}$ and $CS_{10}$.

In the column switch illustrated in FIG. 3, when column selection signal line $Y_{j0}$ becomes an active level, NMOS transistor $Q_{CS-1}$ becomes conductive, electrically connecting bit line BL to global bit line GB. The active level is a normal selection level or boosted level.

Where the column switch illustrated in FIG. 3 is used as column switch $CS_{00}$, bit line BL is bit line $BL_{00}$, and global bit line GB is global bit line $GB_{00}$. Where the column switch illustrated in FIG. 3 is used as column switch $CS_{10}$, bit line BL is bit line $BL_{10}$, and global bit line GB is global bit line $GB_{10}$. Where the column switch illustrated in FIG. 3 is applied to the other column switches $CS_{01}$ to $CS_{07}$ and $CS_{11}$ to $CS_{17}$, the symbols of the bit line, global bit line and column selection signal line connected to the respective terminals (source, drain and gate) of NMOS transistor $Q_{CS-1}$ are replaced with the symbols of the corresponding bit line, global bit line and column selection signal line, respectively.

The above column switch does not require an inverter circuit that generates a reversed-phase signal since it includes an NMOS transistor only. Accordingly, the area requiring formation of a column switch can be reduced.

Figure 4:
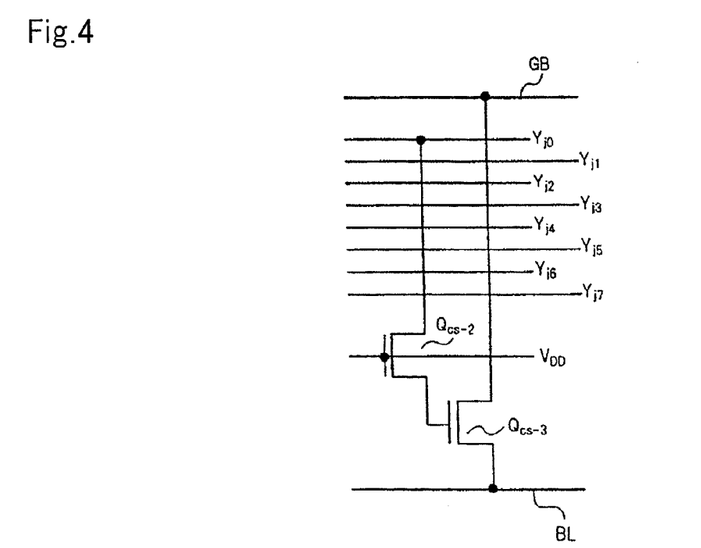
FIG. 4 is a circuit diagram illustrating another example of a column switch.

FIG. 4 illustrates another example of a column switch. This column switch is a self-boost circuit, and includes two NMOS transistors $Q_{CS-2}$ and $Q_{CS-3}$. One of two terminals corresponding to the source and drain of NMOS transistor $Q_{CS-2}$ is connected to a corresponding selection signal line from among column selection signal lines $Y_{j0}$ to $Y_{j7}$, and the other terminal is connected to the gate of NMOS transistor $Q_{CS-3}$.

The gate of NMOS transistor $Q_{CS-2}$ is supplied with power-supply voltage $V_{DD}$. One of two terminals corresponding to the source and drain of NMOS transistor $Q_{CS-3}$ is connected to global bit line GB, and the other terminal is connected to bit line BL. Global bit line GB is a global bit line connected to this column switch, from among global bit lines $GB_{00}$ and $GB_{10}$. Bit line BL is a bit line connected to this column switch, from among bit lines $BL_{00}$ to $BL_{07}$ and $BL_{10}$ to $BL_{17}$.

In the example illustrated in FIG. 4, the gate of NMOS transistor $Q_{CS-3}$ is connected to column selection signal line $Y_{j0}$ via NMOS transistor $Q_{CS-2}$. This is an example of a connection when the column switch illustrated in FIG. 4 is applied to column switches $CS_{00}$ and $CS_{10}$.

In the column switch illustrated in FIG. 4, the gate of NMOS transistor $Q_{CS-2}$ is supplied with power-supply voltage $V_{DD}$, and the gate of NMOS transistor $Q_{CS-3}$ is charged to have a potential $(V_{PP}-V_{th})$ obtained by subtracting threshold voltage $V_{th}$ of the NMOS transistor from voltage $V_{PP}$ obtained by boosting power-supply voltage $V_{DD}$. When bit line BL attains a write voltage level, the gate potential of NMOS transistor $Q_{CS-3}$ rises to a value obtained by adding the potential of bit line BL to the potential $(V_{PP}-V_{th})$. As described above, a self-boost circuit in which a current drive force for NMOS transistor $Q_{CS-3}$ is secured by raising the supply voltage of the gate is formed.

Where the column switch illustrated in FIG. 4 is applied to column switches $CS_{01}$ to $CS_{07}$ and $CS_{11}$ to $CS_{17}$, the symbols of the bit line, global bit line and column selection signal line connected to NMOS transistors $Q_{CS-2}$ and $Q_{CS-3}$ are replaced with the symbols of the corresponding bit line, global bit line and column selection signal line, respectively.

The above configuration using a self-boost circuit also does not require an inverter circuit that generates a reversed-phase signal since it includes an NMOS transistor only. Accordingly, the area requiring formation of a column switch can be reduced.

Figure 5:
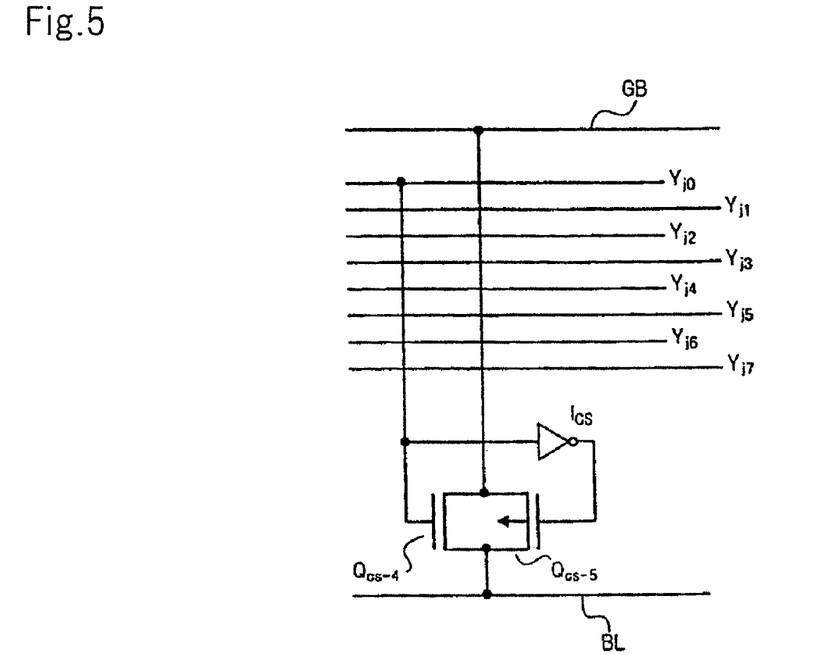
FIG. 5 is a circuit diagram illustrating still another example of a column switch.

FIG. 5 illustrates still another example of a column switch. This column switch is a CMOS-type switch including inverter $I_{CS}$, NMOS transistor $Q_{CS-4}$ and PMOS transistor $Q_{CS-5}$. One of two terminals corresponding to the source and drain of NMOS transistor $Q_{CS-4}$ is connected to global bit line GB, and the other terminal is connected to bit line BL. Global bit line GB is a global bit line connected to this column switch, from among global bit lines $GB_{00}$ and $GB_{10}$. Bit line BL is a bit line connected to this column switch, from among bit lines $BL_{00}$ to $BL_{07}$ and $BL_{10}$ to $BL_{17}$.

The gate of NMOS transistor $Q_{CS-4}$ is connected to a corresponding selection signal line from among column selection signal lines $Y_{j0}$ to $Y_{j7}$. This corresponding selection signal line is connected to the gate of PMOS transistor $Q_{CS-5}$ via inverter $I_{CS}$. In the example illustrated in FIG. 5, the corresponding selection signal line is column selection signal line $Y_{j0}$. This is an example of a connection when the column switch illustrated in FIG. 5 is applied to column switches $CS_{00}$ and $CS_{10}$.

The column switch illustrated in FIG. 5 can provide a bit line selection operation as does the column switch illustrated in FIG. 3. Where the column switch illustrated in FIG. 5 is applied to column switches $CS_{01}$ to $CS_{07}$ and $CS_{11}$ to $CS_{17}$, the symbols of the bit line, global bit line and column selection signal line connected to each of NMOS transistor $Q_{CS-4}$ and PMOS transistor $Q_{CS-5}$ are replaced with the symbols of the corresponding bit line, global bit line and column selection signal line, respectively.

Because of the inclusion of an inverter circuit, the above column switch cannot provide an area reduction effect such as the effect that can be provided by the column switches illustrated in FIGS. and 4, but can reduce power consumption because of employing a CMOS structure.

Referring again to FIG. 1, bit line $BL_{00}$ is connected via NMOS transistor $BQ_{00}$ to the grounding line, which is a reference potential, on the column switch $CS_{00}$ side. Similarly, bit lines $BL_{01}$ to $BL_{07}$ are also connected via NMOS transistors $BQ_{01}$ to $BQ_{07}$ to the grounding line, which is a reference potential, on the column switch $CS_{00}$ side.

Meanwhile, bit line $BL_{10}$ is connected via NMOS transistor $BQ_{10}$ to the grounding line, which is a reference potential, on the column switch $CS_{10}$. Similarly, bit lines $BL_{11}$ to $BL_{17}$ are also connected via NMOS transistors $BQ_{11}$ to $BQ_{17}$ to the grounding line, which is a reference potential, on the column switch $CS_{10}$ side.

Two bit line control signal lines Yod and Yev are respectively arranged on the opposite sides of the memory cell array part. The gates of NMOS transistors $BQ_{00}$, $BQ_{02}$, $BQ_{04}$ and $BQ_{06}$ are connected in common to bit line control signal line Yod on the read/write amplifier 10 side, and the gates of NMOS transistors $BQ_{01}$, $BQ_{03}$, $BQ_{05}$ and $BQ_{07}$ are connected in common to bit line control signal line Yev on the read/write amplifier 10 side. Similarly, the gates of NMOS transistors $BQ_{10}$, $BQ_{12}$, $BQ_{14}$ and $BQ_{16}$ are connected in common to bit line control signal line Yod on the read/write amplifier 11 side, and the gates of NMOS transistors $Q_{11}$, $BQ_{13}$, $BQ_{15}$ and $BQ_{17}$ are connected in common to bit line control signal line Yev on the read/write amplifier 11 side.

An output signal from a first signal generation circuit is supplied to bit line control signal line Yod as a bit line control signal. The first signal generation circuit receives column selection signals from the column selection signal lines connected to the column switches provided to the bit lines located in odd positions, and when any of these column selection signals exhibits a selection level (active level), generates an output signal exhibiting an active level.

Figure 6A:
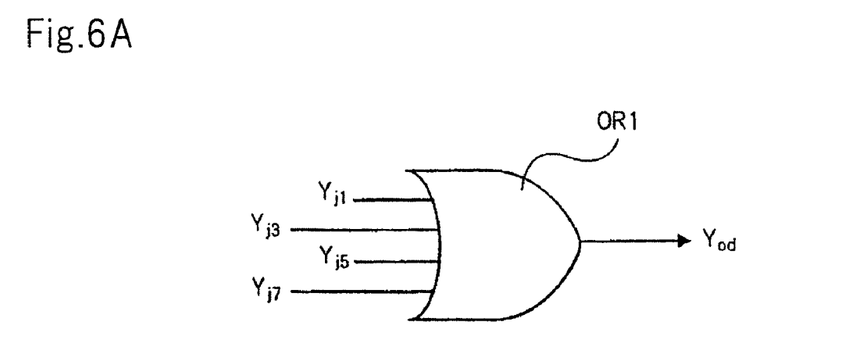
FIG. 6A is a circuit diagram illustrating an example of a signal generation circuit that supplies a bit line control signal to bit line control signal line Yod in the semiconductor memory illustrated in FIG. 1.

FIG. 6A illustrates an OR circuit that supplies a bit line control signal to bit line control signal line Yod, as an example of the first signal generation circuit. This OR receives column selection signals from the odd-numbered column selection signal lines $Y_{j1}$, $Y_{j3}$, $Y_{j5}$ and $Y_{j7}$ as inputs, and ORs these inputs. An output signal from this OR circuit is supplied to bit line control signal line Yod as a bit line control signal.

The column selection signals from column selection signal lines $Y_{j1}$, $Y_{j3}$, $Y_{j5}$ and $Y_{j7}$ are signals for selecting an odd-numbered bit line (i.e., bit line in an even position). When any of these column selection signal lines $Y_{j1}$, $Y_{j3}$, $Y_{j5}$ and $Y_{j7}$ exhibits an active level, the output signal from the OR circuit exhibits an active level. As result, both bit line control signal lines Yod on the read/write amplifier 10 side and the read/write amplifier 11 side exhibit an active level.

When bit line control signal line Yod on the read/write amplifier 10 side exhibits an active level, the even-numbered NMOS transistors $BQ_{00}$, $BQ_{02}$, $BQ_{04}$ and $BQ_{06}$ become conductive. As a result, the even-numbered bit lines $BL_{00}$, $BL_{02}$, $BL_{04}$ and $BL_{06}$ (i.e., bit lines located in odd positions from the bit line $BL_{00}$ side) from among bit lines $BL_{00}$ to $BL_{07}$ are electrically connected to the grounding line. Similarly, when bit line control signal line Yod on the read/write amplifier 11 side exhibits an active level, the even-numbered NMOS transistors $BQ_{10}$, $BQ_{12}$, $BQ_{14}$ and $BQ_{16}$ become conductive. As a result, the even-numbered bit lines $BL_{10}$, $BL_{12}$, $BL_{14}$ and $BL_{16}$ (bit lines located in odd positions from the bit line $BL_{10}$ side) from among bit lines $BL_{10}$ to $BL_{17}$ are electrically connected to the grounding line.

An output signal from a second signal generation circuit is supplied to bit line control signal line Yev as a bit line control signal. The second signal generation circuit receives column selection signals from the column selection signal lines connected to the column switches provided to the bit lines located in even positions, and when any of these column selection signals exhibits a selection level (active level), generates an output signal exhibiting an active level.

Figure 6B:
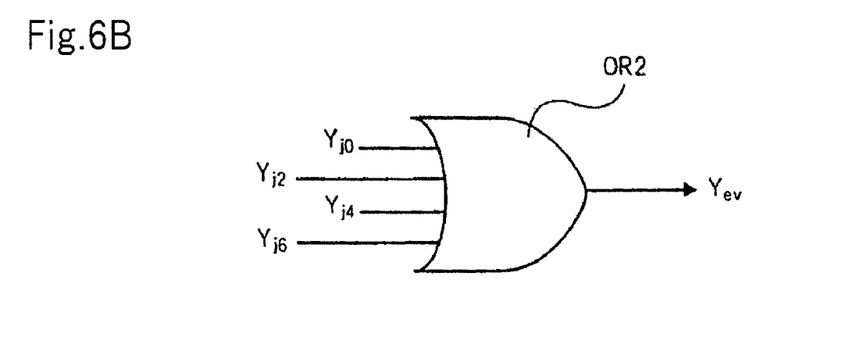
FIG. 6B is a circuit diagram illustrating an example of a signal generation circuit that supplies a bit line control signal to bit line control signal line Yev in the semiconductor memory illustrated in FIG. 1.

FIG. 6B illustrates an OR circuit that supplies a bit line control signal to bit line control signal line Yev, as an example of the second signal generation circuit. This OR circuit receives column selection signals from the even-numbered column selection signal lines $Y_{j0}$, $Y_{j2}$, $Y_{j4}$ and $Y_{j6}$ as inputs, and ORs these inputs. An output signal from this OR circuit is supplied to bit line control signal line Yev as a bit line control signal.

The column selection signals from column selection signal lines $Y_{j0}$, $Y_{j2}$, $Y_{j4}$ and $Y_{j6}$ are signals for selecting an even-numbered bit line (i.e., bit line in an odd position). When any of these column selection signal lines $Y_{j0}$, $Y_{j2}$, $Y_{j4}$ and $Y_{j6}$ exhibits an active level, the output signal from the OR circuit exhibits an active level. As a result, both bit line control signal lines Yev on the read/write amplifier 10 side and the read/write amplifier 11 side exhibit an active level.

When bit line control signal line Yev on the read/write amplifier 10 side exhibits an active level, the odd-numbered NMOS transistors $BQ_{01}$, $BQ_{03}$, $BQ_{05}$ and $BQ_{07}$ become conductive. As a result, the odd-numbered bit lines $BL_{01}$, $BL_{03}$, $BL_{05}$ and $BL_{07}$ (i.e., bit lines located in even positions from the $BL_{00}$ side) from among bit lines $BL_{00}$ to $BL_{07}$ are electrically connected to the grounding line. Similarly, when bit line control signal line Yev on the read/write amplifier 11 side exhibits an active level, the odd-numbered NMOS transistors $BQ_{11}$, $BQ_{13}$, $BQ_{15}$ and $BQ_{17}$ become conductive. As a result, the odd-numbered bit lines $BL_{11}$, $BL_{13}$, $BL_{15}$ and $BL_{17}$ (bit lines located in even positions from the bit line $BL_{10}$ side) from among bit lines $BL_{10}$ to $BL_{17}$ are electrically connected to the grounding line.

In the above-described semiconductor memory according to the present embodiment, when any one of column selection signal lines $Y_{j0}$ to $Y_{j7}$ exhibit an active level, one bit line in a first bit line group (bit lines $BL_{00}$ to $BL_{07}$) and one bit line in a second bit line group (bit lines $BL_{10}$ to $BL_{17}$) are selected in parallel, and the bit lines adjacent to these selected bit lines are clamped to a reference potential. Also, at least one of the remaining non-selected bit lines is in a floating state.

As an example, an operation when column selection signal line $Y_{j3}$ is brought into an active level to select bit line $BL_{03}$ in the first bit line group and bit line $BL_{13}$ in the second bit line group, respectively, will be described.

When column selection signal line $Y_{j3}$ exhibits an active level, column switches $CS_{03}$ and $CS_{13}$ become conductive, and both bit line control signal lines Yod on the read/write amplifier 10 side and the read/write amplifier 11 side exhibit an active level.

When column switch $CS_{03}$ becomes conductive, bit line $BL_{03}$ is electrically connected to read/write amplifier 10 via global bit line $GB_{00}$. Similarly, when column switch $CS_{13}$ becomes conductive, bit line $BL_{13}$ is electrically connected to read/write amplifier 11 via global bit line $GB_{10}$.

When bit line control signal line Yod on the read/write amplifier 10 side exhibits an active level, NMOS transistors $BQ_{00}$, $BQ_{02}$, $BQ_{04}$ and $BQ_{06}$ become conductive, and bit lines $BL_{00}$, $BL_{02}$, $BL_{04}$ and $BL_{06}$ are electrically connected to the grounding line. Similarly, when bit line control signal line Yod on the read/write amplifier 11 side exhibits an active level, NMOS transistors $BQ_{10}$, $BQ_{12}$, $BQ_{14}$ and $BQ_{16}$ become conductive, and bit lines $BL_{10}$, $BL_{12}$, $BL_{14}$ and $BL_{16}$ are electrically connected to the grounding line. Since bit line control signal line Yev exhibits an inactive level, bit lines $BL_{01}$, $BL_{03}$, $BL_{05}$, $BL_{07}$, $BL_{11}$, $BL_{13}$, $BL_{15}$ and $BL_{17}$ are in a floating state.

In the semiconductor memory according to the present embodiment, using a plurality of column selection signals (more specifically, column selection signal lines $Y_{j0}$ to $Y_{j7}$) for selecting a plurality of bit lines individually, transistors BQ (more specifically, NMOS transistors $BQ_{00}$ to $BQ_{07}$ and $BQ_{10}$ to $BQ_{17}$) for clamping bit lines to a reference potential are controlled. More specifically, the transistors for clamping bit lines located in even positions to a reference potential are controlled via a first bit line control signal (bit line control signal line Yod), which is an OR of column selection signals for selecting a bit line located in an odd position, and the transistors for clamping bit lines located in odd positions to a reference potential are controlled via a second bit line control signal (bit line control signal line Yev), which is an OR of column selection signals for selecting a bit line located in an even position.

In the above-described operation, the non-selected bit lines adjacent to the selected bit lines are clamped to a reference potential, and thus, it is possible to suppress noise from the word lines or the substrate affecting the selected bit lines via the non-selected bit lines.

Also, first and second bit line control signals can be formed by the respective logic circuits (OR circuits). In other words, a circuit necessary for controlling the transistors for clamping can be formed by two OR circuits. The number of circuit components in this case is smaller than that of the case where an inverter is provided for each bit line. Accordingly, cost reduction and downsizing of a memory can be provided.

In the configuration illustrated in FIG. 1, the number and arrangement of memory cells, column switches, transistors and bit lines are arbitrarily changed. However, the arrangement and selection procedure of bit lines should be determined so as to ensure that non-selected bit lines adjacent to a selected bit line are clamped to a reference potential.

Second Embodiment

Figure 7:
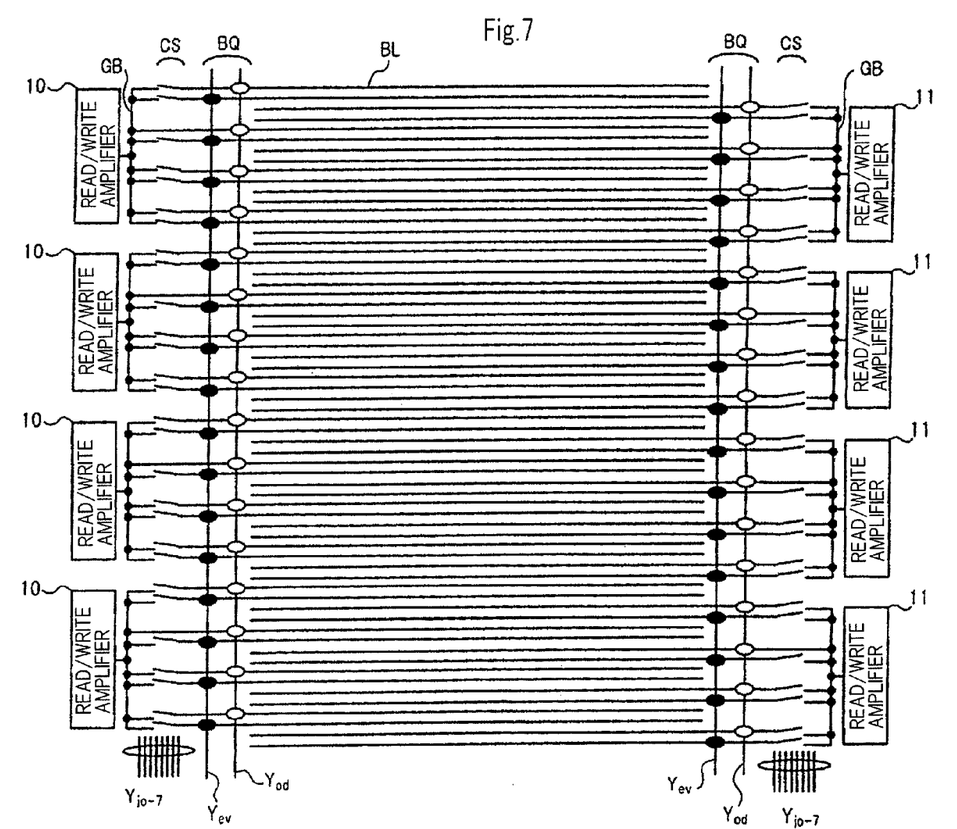
FIG. 7 is a block diagram illustrating a configuration of a main part of a semiconductor memory according to a second embodiment of the present invention.

Referring FIG. 7, a semiconductor memory according to a second embodiment of the present invention includes four sets of the configuration illustrated in FIG. 1, and all the sets share word lines. In FIG. 7, word lines and memory cells MC are not illustrated. Column switches are denoted by switch symbols, and transistors BQ for clamping bit lines to a reference potential are denoted by circle symbols. From among the circle symbols, a black circle denotes a conductive state and a white circuit denotes a non-conductive state.

In the semiconductor memory according to the present embodiment, also, as in the first embodiment, column switches CS in each of the sets select bit lines based on column selection signal lines $Y_{j0}$ to $Y_{j7}$. NMOS transistors $BQ_{00}$, $BQ_{02}$, $BQ_{04}$ and $BQ_{06}$ on the read/write amplifier 10 side and NMOS transistors $BQ_{10}$, $BQ_{12}$, $BQ_{14}$ and $BQ_{16}$ on the read/write amplifier 11 side are controlled via bit line control signal Yod, which is an OR of column selection signal lines $Y_{j1}$, $Y_{j3}$, $Y_{j5}$ and $Y_{j7}$. NMOS transistors $BQ_{01}$, $BQ_{03}$, $BQ_{05}$ and $BQ_{07}$ on the read/write amplifier 10 side and NMOS transistors $BQ_{11}$, $BQ_{13}$, $BQ_{15}$ and $BQ_{17}$ on the read/write amplifier 11 side are controlled via bit line control signal Yev, which is an OR of column selection signal lines $Y_{j0}$, $Y_{j2}$, $Y_{j4}$ and $Y_{j6}$. Consequently, an operation similar to that of the first embodiment is provided.

FIG. 7 illustrates a connection state when column selection signal line $Y_{j2}$ exhibits an active level. In each read/write amplifier 10, the third bit line BL (bit line $BL_{02}$ in FIG. 1) is electrically connected to global bit line $GB_{00}$ via column switch CS (column switch $CS_{02}$ in FIG. 1). Similarly, in each read/write amplifier 11, the third bit line BL (bit line $BL_{12}$ in FIG. 1) is electrically connected to global bit line $GB_{10}$ via column switch CS (column switch $CS_{12}$ in FIG. 1).

In the present embodiment, also, as in the first embodiment, the non-selected bit lines adjacent to the selected bit lines are clamped to a reference potential, and thus, it is possible to suppress noise from the word lines or the substrate affecting the selected bit lines via the non-selected bit lines.

First and second bit line control signals can be formed by logic circuits (OR circuits), respectively, and in addition, the first and second bit line control signals are shared by all the sets. The number of components in this case is smaller than that of the case where each set includes a configuration provided with an inverter for each bit line. Accordingly, it is possible to provide an advantage in cost reduction and downsizing of memory.

In the configuration illustrated in FIG. 7, the number and arrangement of memory cells, column switches, transistors and bit lines can be arbitrarily determined. Also, the number of sets is not limited to four. The number of sets may be greater than or equal to one. However, the arrangement and selection procedure of bit lines should be determined so as to ensure that non-selected bit lines adjacent to a selected bit line are clamped to a reference potential.

Third Embodiment

Figure 8:
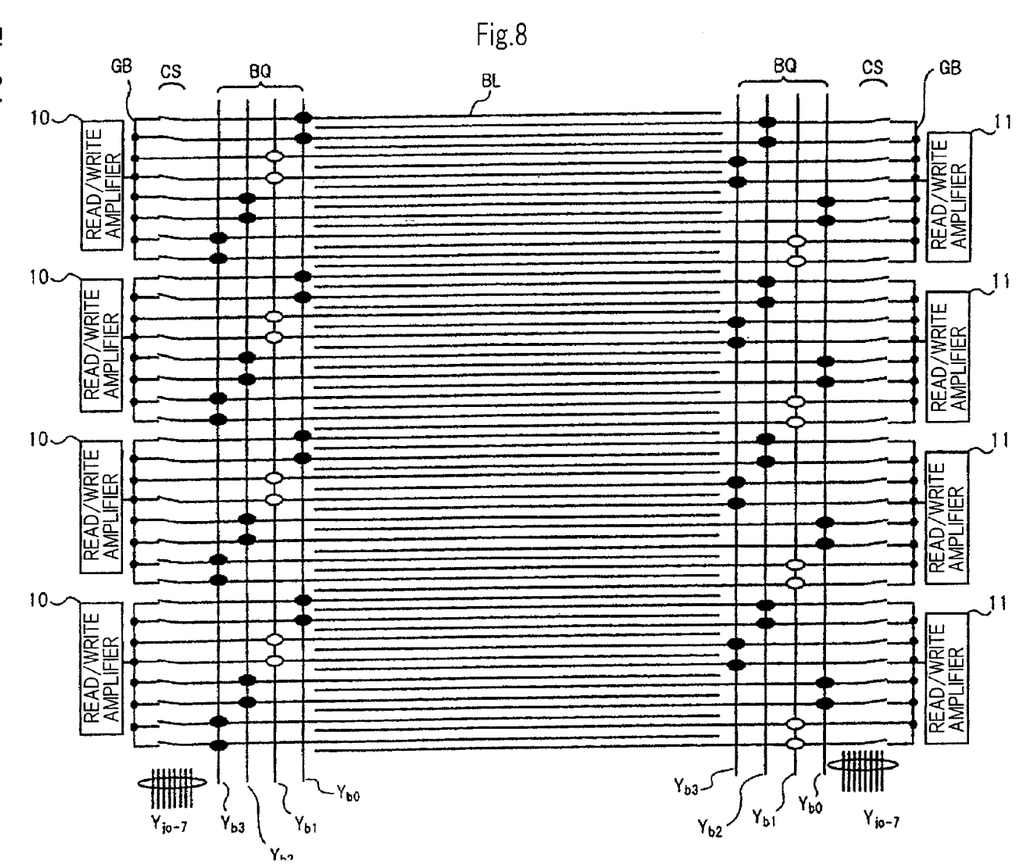
FIG. 8 is a block diagram illustrating a configuration of a main part of a semiconductor memory according to the third embodiment of the present invention.

FIG. 8 is a block diagram illustrating a configuration of a main part of a semiconductor memory according to the third embodiment of the present invention. In FIG. 8, word lines and memory cells MC are not illustrated. Also, column switches are denoted by switch symbols, and transistors BQ for clamping are denoted by circle symbols. A black circle denotes a conductive state, and a white circle denotes a non-conductive state.

In the semiconductor memory according to the present embodiment, the structure of connection between bit line control signal lines and transistors BQ for clamping, bit line selection operation and bit line clamping operation are different from those in the second embodiment. The rest of the configuration is basically the same as that in the second embodiment. Here, a detailed description will be given on the structures that are different from those in the second embodiment, and a detailed description of the same structures will be omitted.

In the semiconductor memory according to the present embodiment, instead of two bit line control signal lines Yod and Yev, four bit line control signal lines Yb0 to Yb3 are provided, and bit line control signals for controlling transistors BQ for clamping (NMOS transistors $BQ_{00}$ to $BQ_{07}$ and $BQ_{10}$ to $BQ_{17}$ in FIG. 1) are generated via bit line control signal lines Yb0 to Yb3.

A bit line group (bit lines in $BL_{00}$ to $BL_{07}$ in FIG. 1) on the read/write amplifier 10 side and a bit line group (bit lines $BL_{10}$ to $BL_{17}$ in FIG. 1) on the read/write amplifier 11 side are provided in parallel so that each other's bit lines are alternately arranged. In other words, for each set of the read/write amplifiers 10 and 11, bit lines BL are arranged in the order of $BL_{00}$, $BL_{10}$, $BL_{01}$, $BL_{11}$, $BL_{02}$, $BL_{12}$, $BL_{03}$, $BL_{13}$, $BL_{04}$, $BL_{14}$, $BL_{05}$, $BL_{15}$, $BL_{06}$, $BL_{16}$, $BL_{07}$ and $BL_{17}$.

On the read/write amplifier 10 side, column switches CS are controlled so that bit lines are selected in the order of $BL_{00}$, $BL_{01}$, $BL_{02}$, $BL_{03}$, $BL_{04}$, $BL_{05}$, $BL_{06}$ and $BL_{07}$ according to the active level states of column selection signal lines $Y_{j0}$ to $Y_{j7}$. Meanwhile, on the read/write amplifier 11 side, column switches CS are controlled so that bit lines are selected in the order of $BL_{04}$, $BL_{05}$, $BL_{06}$, $BL_{07}$, $BL_{00}$, $BL_{01}$, $BL_{02}$ and $BL_{03}$ according to the active level states of column selection signal lines $Y_{j0}$ to $Y_{j7}$.

In the present embodiment, the bit lines processed on the read/write amplifier 10 side and the bit lines processed on the read/write amplifier 11 side are alternately arranged, and thus, four bit line control signal lines Yb0 to Yb3 are used.

A signal generation circuit is connected to each of bit line control signal lines Yb0 to Yb3. An output signal from each signal generation circuit is supplied to a corresponding bit line control signal line from among bit line control signal line Yb0 to Yb3, as a bit line control signal. Each signal generation circuit receives column selection signals from column selection signal lines connected to the column switches provided to the respective bit lines in the bit line group (partial bit line group) connected to the corresponding bit line control signal line, and when all of these column selection signals exhibit a non-selection level (inactive level), generates an output signal exhibiting an active level.

Figure 9A:
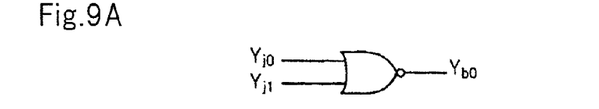
FIG. 9A is a circuit diagram illustrating an example of a signal generation circuit that supplies a bit line control signal to bit line control signal line Yb0 in the semiconductor memory illustrated in FIG. 8.

FIG. 9A illustrates a NOR circuit, which is an example of a signal generation circuit that supplies a bit line control signal to bit line control signal line Yb0. This NOR circuit receives column selection signals from column selection signal lines $Y_{j0}$ and $Y_{j1}$ as inputs, and NORs these inputs. An output signal from this NOR circuit is supplied to bit line control signal line Yb0 as a bit line control signal.

On the read/write amplifier 10 side, column switch CS to which bit line $BL_{00}$ is connected (column switch $CS_{00}$ in FIG. 1) is controlled according to the signal level of column selection signal line $Y_{j0}$, and column switch CS to which bit line $BL_{01}$ is connected (column switch $CS_{01}$ in FIG. 1) is controlled according to the signal level of column selection signal line $Y_{j1}$. On the read/write amplifier 11 side, column switch CS to which bit line $BL_{04}$ is connected (column switch $CS_{04}$ in FIG. 1) is controlled according to the signal level of column selection signal line $Y_{j0}$, and column switch CS to which bit line $BL_{05}$ is connected (column switch $CS_{05}$ in FIG. 1) is controlled according to the signal level of column selection signal line $Y_{j1}$.

When either column selection signal line $Y_{j0}$ or $Y_{j1}$ exhibits an active level, an output signal from the NOR circuit becomes an inactive level, and when both column selection signal lines $Y_{j0}$ and $Y_{j1}$ exhibit an inactive level, an output signal from the NOR circuit exhibits an active level.

When an output signal from the NOR circuit exhibits an inactive level, NMOS transistors QB connected to bit lines $BL_{00}$ and $BL_{01}$ on the read/write amplifier 10 side (NMOS transistors $QB_{00}$ and $QB_{01}$ in FIG. 1) and NMOS transistors QB connected to bit lines $BL_{04}$ and $BL_{05}$ on the read/write amplifier 11 side (NMOS transistors $QB_{04}$ and $QB_{05}$ in FIG. 1) are all in a non-conductive state. When an output signal from the NOR circuit exhibits an active level, NMOS transistors $QB_{00}$ and $QB_{01}$ on the read/write amplifier 10 and NMOS transistors $QB_{04}$ and $QB_{05}$ on the read/write amplifier 11 side are all in a conductive state.

Figure 9B:
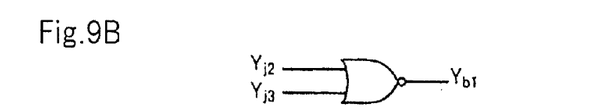
FIG. 9B is a circuit diagram illustrating an example of a signal generation circuit that supplies a bit line control signal to bit line control signal line Yb1 in the semiconductor memory illustrated in FIG. 8.

FIG. 9B illustrates a NOR circuit, which is an example of a signal generation circuit that supplies a bit line control signal to bit line control signal line Yb1. This NOR circuit receives column selection signals from column selection signal lines $Y_{j2}$ and $Y_{j3}$ as inputs, and NORs these inputs. An output signal from this NOR circuit is supplied to bit line control signal line Yb1 as a bit line control signal.

On the read/write amplifier 10 side, column switch CS to which bit line $BL_{02}$ is connected (column switch $CS_{02}$ in FIG. 1) is controlled according to the signal level of column selection signal line $Y_{j2}$, and column switch CS to which bit line $BL_{03}$ is connected (column switch $CS_{03}$ in FIG. 1) is controlled according to the signal level of column selection signal line $Y_{j3}$. On the read/write amplifier 11 side, column switch CS to which bit line $BL_{06}$ is connected (column switch $CS_{06}$ in FIG. 1) is controlled according to the signal level of column selection signal line $Y_{j2}$, and column switch CS to which bit line $BL_{07}$ is connected (column switch $CS_{07}$ in FIG. 1) is controlled according to the signal level of column selection signal line $Y_{j3}$.

When either column selection signal line $Y_{j2}$ or $Y_{j3}$ exhibits an active level, an output signal from the NOR circuit becomes an inactive level, and when both column selection signal lines $Y_{j2}$ and $Y_{j3}$ exhibit an inactive level, an output signal from the NOR circuit exhibits an active level.

When an output signal from the NOR circuit exhibits an inactive level, NMOS transistors QB connected to bit lines $BL_{02}$ and $BL_{03}$ on the read/write amplifier 10 side (NMOS transistors $QB_{02}$ and $QB_{03}$ in FIG. 1) and NMOS transistors QB connected to bit lines $BL_{06}$ and $BL_{07}$ on the read/write amplifier 11 side (NMOS transistors $QB_{06}$ and $QB_{07}$ in FIG. 1) are all in a non-conductive state. When an output signal from the NOR circuit exhibits an active level, NMOS transistors $QB_{02}$ and $QB_{03}$ on the read/write amplifier 10 side and NMOS transistors $QB_{06}$ and $QB_{07}$ on the read/write amplifier 11 side are all in a conductive state.

Figure 9C:
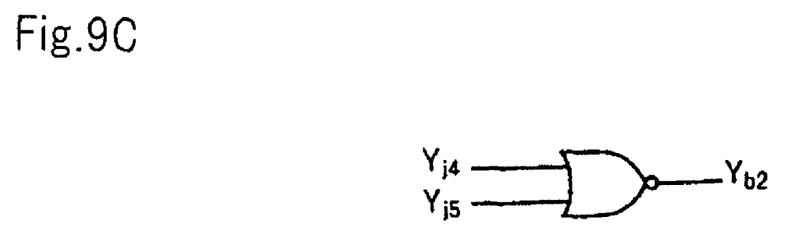
FIG. 9C is a circuit diagram illustrating an example of a signal generation circuit that supplies a bit line control signal to bit line control signal line Yb2 in the semiconductor memory illustrated in FIG. 8.

FIG. 9C illustrates a NOR circuit, which is an example of a signal generation circuit that supplies a bit line control signal to bit line control signal line Yb2. This NOR circuit receives column selection signals from column selection signal lines $Y_{j4}$ and $Y_{j5}$ as inputs, and NORs these inputs. An output signal from this NOR circuit is supplied to bit line control signal line Yb2 as a bit line control signal.

On the read/write amplifier 10 side, column switch CS to which bit line $BL_{04}$ is connected (column switch $CS_{04}$ in FIG. 1) is controlled according to the signal level of column selection signal line $Y_{j4}$, and column switch CS to which bit line $BL_{05}$ is connected (column switch $CS_{05}$ in FIG. 1) is controlled according to the signal level of column selection signal line $Y_{j5}$. On the read/write amplifier 11 side, column switch CS to which bit line $BL_{00}$ is connected (column switch $CS_{00}$ in FIG. 1) is controlled according to the signal level of column selection signal line $Y_{j4}$, and column switch CS to which bit line $BL_{01}$ is connected (column switch $CS_{01}$ in FIG. 1) is controlled according to the signal level of column selection signal line $Y_{j5}$.

When either column selection signal line $Y_{j4}$ or $Y_{j5}$ exhibits an active level, an output signal from the NOR circuit becomes an inactive level, and when both column selection signal lines $Y_{j4}$ and $Y_{j5}$ exhibit an inactive level, the output signal of the NOR circuit exhibits an active level.

When an output signal from the NOR circuit exhibits an inactive level, NMOS transistors QB connected to bit lines $BL_{04}$ and $BL_{05}$ on the read/write amplifier 10 side (NMOS transistors $QB_{04}$ and $QB_{05}$ in FIG. 1) and NMOS transistors QB connected to bit lines $BL_{00}$ and $BL_{01}$ on the read/write amplifier 11 side (NMOS transistors $QB_{00}$ and $QB_{01}$ in FIG. 1) are all in a non-conductive state. When an output signal from the NOR circuit exhibits an active level, NMOS transistors $QB_{04}$ and $QB_{05}$ on the read/write amplifier 10 side and NMOS transistors $QB_{00}$ and $QB_{01}$ on the read/write amplifier 11 side are all in a conductive state.

Figure 9D:
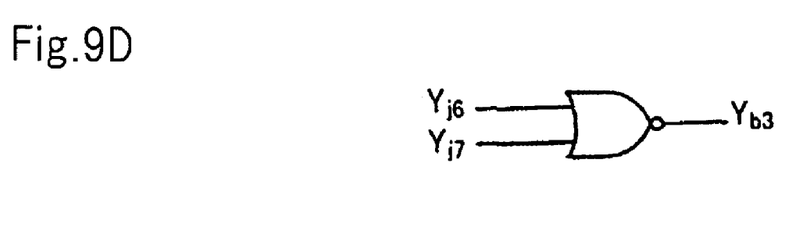
FIG. 9D is a circuit diagram illustrating an example of a signal generation circuit that supplies a bit line control signal to bit line control signal line Yb3 in the semiconductor memory illustrated in FIG. 8.

FIG. 9D illustrates a NOR circuit, which is an example of a signal generation circuit that supplies a bit line control signal to bit line control signal line Yb3. This NOR circuit receives column selection signals from column selection signal lines $Y_{j6}$ and $Y_{j7}$ as inputs, and NORs these inputs. An output signal from this NOR circuit is supplied to bit line control signal line Yb3 as a bit line control signal.

On the read/write amplifier 10 side, column switch CS to which bit line $BL_{06}$ is connected (column switch $CS_{06}$ in FIG. 1) is controlled according to the signal level of column selection signal line $Y_{j6}$, and column switch CS to which bit line $BL_{07}$ is connected (column switch $CS_{07}$ in FIG. 1) is controlled according to the signal level of column selection signal line $Y_{j7}$. On the read/write amplifier 11 side, column switch CS to which bit line $BL_{02}$ is connected (column switch $CS_{02}$ in FIG. 1) is controlled according to the signal level of column selection signal line $Y_{j6}$, and column switch CS to which bit line $BL_{03}$ is connected (column switch $CS_{03}$ in FIG. 1) is controlled according to the signal level of column selection signal line $Y_{j7}$.

When either column selection signal line $Y_{j6}$ or $Y_{j7}$ exhibits an active level, an output signal from the NOR circuit exhibits an inactive level, and when both column selection signal lines $Y_{j6}$ and $Y_{j7}$ exhibit an inactive level, an output signal from the NOR circuit exhibits an active level.

When an output signal from the NOR circuit exhibits an inactive level, NMOS transistors QB connected to bit lines $BL_{06}$ and $BL_{07}$ on the read/write amplifier 10 side (NMOS transistor $QB_{06}$ and $QB_{07}$ in FIG. 1) and NMOS transistors QB connected to bit lines $BL_{02}$ and $BL_{03}$ on the read/write amplifier 11 side (NMOS transistors $QB_{02}$ and $QB_{03}$ in FIG. 1) are all in a non-conductive state. When an output signal from the NOR circuit exhibits an active level, NMOS transistors $QB_{06}$ and $QB_{07}$ on the read/write amplifier 10 side and NMOS transistors $QB_{02}$ and $QB_{03}$ on the read/write amplifier 11 side are all in a conductive state.

In the above-described semiconductor memory according to the present embodiment, for each set of read/write amplifier 10 and 11, when any one of column selection signal lines $Y_{j0}$ to $Y_{j7}$ exhibits an active level, one bit line in a first bit line group (bit lines $BL_{00}$ to $BL_{07}$) and one bit line in a second bit line group (bit lines $BL_{10}$ to $BL_{17}$) are selected in parallel, and the bit lines adjacent to these selected bit lines are clamped to a reference potential. Also, at least one of the remaining non-selected bit lines is in a floating state.

As an example, an operation when column selection signal line $Y_{j2}$ is brought into an active level to select bit line $BL_{02}$ in the first bit line group and bit line $BL_{16}$ in the second bit line group, respectively, will be described.

When column selection signal line $Y_{j2}$ exhibits an active level, column switches $CS_{02}$ and $CS_{14}$ become conductive. Concurrently, both bit line control signal lines Yb1 on the read/write amplifier 10 side and read/write amplifier 11 side exhibit an inactive level. The other bit line control signal lines Yb0, Yb2 and Yb3 all exhibit an active level.

On the read/write amplifier 10 side, when column switch $CS_{02}$ becomes conductive, bit line $BL_{02}$ is electrically connected to read/write amplifier 10 via global bit line $GB_{00}$.

Also, when bit line control signal lines Yb0, Yb2 and Yb3 exhibit an active level while bit line control signal line Yb1 exhibits an inactive level, NMOS transistors $BQ_{00}$, $BQ_{01}$, $BQ_{04}$, $BQ_{05}$, $BQ_{06}$ and $BQ_{07}$ become conductive while NMOS transistors $BQ_{02}$ and $BQ_{03}$ become non-conductive. In this case, each of bit lines $BL_{00}$, $BL_{01}$, $BL_{04}$, $BL_{05}$, $BL_{06}$ and $BL_{07}$ is electrically connected to a grounding line. Also, bit line $BL_{03}$ is in a floating state.

On the read/write amplifier 11 side, when column switch $CS_{14}$ becomes conductive, bit line $BL_{14}$ is electrically connected to read/write amplifier 11 via global bit line $GB_{10}$.

Also, when bit line control signal lines Yb0, Yb2 and Yb3 exhibit an active level while bit line control signal line Yb1 exhibits an inactive level, NMOS transistors $BQ_{10}$, $BQ_{11}$, $BQ_{12}$, $BQ_{13}$, $BQ_{14}$ and $BQ_{15}$ become conductive while NMOS transistors $BQ_{16}$ and $BQ_{17}$ become non-conductive. In this case, each of bit lines $BL_{10}$, $BL_{11}$, $BL_{12}$, $BL_{13}$, $BL_{14}$ and $BL_{15}$ is electrically connected to the grounding line. Also, bit line $BL_{17}$ is in a floating state.

In the semiconductor memory according to the present embodiment, one bit line in the first bit line group on the read/write amplifier 10 side and one bit line in the second bit line group on the read/write amplifier 11 side are selected in parallel, and the bit lines adjacent to these selected bit lines are clamped to a reference potential while at least one of the remaining non-selected bit lines is in a floating state. This operation, as in the first and second embodiments, enables suppressing noise from the word lines or from the substrate that affects the selected bit lines via the non-selected bit lines.

Also, on each of the read/write amplifier 10 and 11 sides, bit line control signals for controlling transistors for clamping bit lines to a reference potential are generated by four NOR circuits. The number of circuit components in this case is smaller than that of the case where an inverter is provided for each bit line. Accordingly, cost reduction and downsizing of memory can be provided.

In the configuration illustrated in FIG. 8, the number and arrangements of memory cells, column switches, transistors and bit lines can be arbitrarily determined. Also, the number of sets is not limited to four: The number of sets is more than or equal to one. However, the arrangement and selection procedure of bit lines should be determined so as to ensure that non-selected bit lines adjacent to a selected bit line are clamped to a reference potential.

Each of the above-described embodiments is a mere example of the present invention, and its configuration and operation can be arbitrarily changed. For example, although in each of the embodiments, transistors that are included in memory cells, transistors that are included in column switches and transistors for clamping are N-type transistors, these transistors may be P-type transistors.

A semiconductor memory according to an aspect of the present invention includes: a first read/write amplifier; a second read/write amplifier; a first group of bit lines selectively connected to the first read/write amplifier; and a second group of bit lines selectively connected to the second read/write amplifier. The bit lines in the first bit line group and the bit lines in the second bit line group are alternately arranged by a fixed number. One bit line is selected from each of the first and second bit line groups in parallel, and a non-selected bit line adjacent to the selected bit line is clamped to a reference potential while at least one of the remaining non-selected bit lines in each of the first and second bit line groups is in a floating state. Here, the first and second read/write amplifiers respectively correspond to read/write amplifiers 10 and 11 described in the embodiments.

The semiconductor memory may be configured so as to include column switch means for receiving, as an input, a column selection signal for individually designating a plurality of bit lines included in each of the first and second bit line groups, and selecting a bit line designated by the column selection signal from each of the first and second bit line groups; and clamping means for individually clamping bit lines in the first and second bit line groups to the reference potential, wherein the first and second bit line groups each include a plurality of partial bit line groups each including a fixed number of bit lines, and the clamping means renders a partial bit line group including the bit line designated by the column selection signal in a floating state, and clamps a remaining partial bit line group to the reference potential. Here, the column switch means corresponds to column switches $CS_{00}$ to $CS_{07}$ and $CS_{10}$ to $CS_{17}$ in each of the embodiments. The clamping means corresponds to NMOS transistors $BQ_{00}$ to $BQ_{07}$ and $BQ_{10}$ to $BQ_{17}$ in each of the embodiments. The column selection signal corresponds to column selection signal lines $Y_{j0}$ to $Y_{j7}$ in each of the embodiments.

A semiconductor memory according to another aspect of the present invention includes: a plurality of first bit lines; a plurality of second bit lines arranged among the first bit lines in a mixed manner; a first read/write amplifier; a second read/write amplifier; a plurality of first column switches each provided between a corresponding first bit line from among the plurality of first bit lines and the first read/write amplifier, each of the first column switches being brought into conduction by a corresponding column selection signal from among a plurality of column selection signals, selecting one from among the plurality of first bit lines and connecting the first bit line to the first read/write amplifier; a plurality of second column switches each provided between a corresponding second bit line from among the plurality of second bit lines and the second read/write amplifier, each of the second column switches being brought into conduction by a corresponding column selection signal from among the plurality of column selection signals, selecting one from among the plurality of second bit lines and connecting the second bit line to the second read/write amplifier; a plurality of bit line control switches each connected between a corresponding bit line from among the first and second lines and a reference potential point; and a logic gate that at least brings bit line control switches respectively connected to bit lines which are adjacent to the bit line selected from each of the first and second bit lines and which are arranged on opposite sides of the selected bit line into conduction, in response to any of signals that are fewer in number than the plurality of column selection signals. Here, the first and second read/write amplifiers, the plurality of first column switches, the plurality of second column switches, the plurality of bit line control switches correspond respectively to read/write amplifiers 10 and 11, column switches $CS_{00}$ to $CS_{07}$ and $CS_{10}$ to $CS_{17}$, NMOS transistors $BQ_{00}$ to $BQ_{07}$ and $BQ_{10}$ to $BQ_{17}$ described in each of the embodiments. Also, the logic gate corresponds to a signal generation circuit described in each of the embodiments (the OR circuits illustrated in FIGS. 6A and 6B or the NOR circuits illustrated in FIGS. 9A to 9D).

With any of the above-described aspects, the effect of noise on selected bit lines can be suppressed, and the number of circuit components can be made to be smaller than that of a circuit provided with an inverter for each bit line. Accordingly, a highly-stable, low-cost semiconductor memory can be provided.

The present invention can be applied to the entire range of semiconductor memories including hierarchized bit lines.

It is apparent that the present invention is not limited to the above embodiments, but may be modified and changed without departing from the scope and spirit of the invention.

What is claimed is:
1. A semiconductor device comprising:
a first read/write amplifier;
a second read/write amplifier;
a first group of bit lines belonging to the first read/write amplifier;
a second group of bit lines belonging to the second read/write amplifier and mixed with the first group of bit lines;
a selection circuit designating one of the first group of bit lines and one of the second group of bit lines respectively to a first selected bit line and a second selected bit line in parallel to each other while designating remaining ones of the first group of bit lines and remaining ones of the second group of bit lines respectively to first non-selected bit lines and second non-selected bit lines, and
a control circuit supplying a reference potential to at least one of the first non-selected bit lines, which is adjacent to the first selected bit line, and to at least one of the second non-selected bit lines, which is adjacent to the second selected bit line, and bringing at least one of remaining ones of the first and second non-selected bit lines into a floating state.

2. The semiconductor device according to claim 1, wherein
the selection circuit receives a set of column selection signals, that individually designates a plurality of bit lines included in each of the first group of bit lines and the second group of bit lines, and selects a bit line designated by the set of column selection signals from each of the first group of bit lines and the second group of bit lines;
the control circuit includes a clamp circuit individually supplying the reference potential bit lines included in each of the first group of bit lines and the second group of bit lines; and
the first group of bit lines and the second group of bit lines each include a plurality of partial bit line groups each including a fixed number of bit lines, and
wherein the clamp circuit brings a partial bit line group including the bit line designated by the set of column selection signals to the floating state, and supplies the reference potential to a remaining partial bit line group.

3. The semiconductor device according to claim 2, wherein
the bit lines included in each of the first group of bit lines and the second group of bit lines are arranged two by two alternately;
the selection circuit includes a plurality of column switches provided for the respective bit lines included in each of the first group of bit lines and the second group of bit lines, each column switch being connected to a column selection signal line that controls a switch operation thereof; and
for each of the first group of bit lines and the second group of bit lines, the clamp circuit, based on an OR of column selection signals supplied from column selection signal lines connected to column switches provided to bit lines located in odd positions from one side, supplies the reference potential to bit lines located in even positions from the same side, and based on an OR of column selection signals supplied from column selection signal lines connected to column switches provided to the bit lines located in even positions from the same side, supplies the reference potential to the bit lines located in odd positions from the same side.

4. The semiconductor device according to claim 3, wherein the control circuit further includes:
a first signal generation circuit to which a first set of column selection signals is supplied from the column selection signal lines connected to the column switches provided to the bit lines located in odd positions, and which, when any signal of the first set of column selection signals exhibits a selection level, generates an output signal exhibiting an active level; and
a second signal generation circuit to which a second set of column selection signals is supplied from the column selection signal lines connected to the column switches provided to the bit lines located in even positions, and which, when any signal of the second set of column selection signals exhibit the selection level, generates an output signal exhibiting the active level; and
the clamp circuit includes:
a plurality of first clamp switches which are provided for the respective bit lines located in even positions in each of the first group of bit lines and the second group of bit lines, the plurality of first clamp switches being connected in common to a first bit line control signal line to which the output signal from the first signal generation circuit is supplied; and
a plurality of second clamp switches which are provided for the respective bit lines located in odd positions in each of the first group of bit lines and the second group of bit lines, the plurality of second clamp switches being connected in common to a second bit line control signal line to which the output signal from the first signal generation circuit is supplied.

5. The semiconductor memory according to claim 4, comprising a plurality of sets each including the first and second read/write amplifiers, the first group of bit lines, the second group of bit lines, the selection circuit and the clamp circuit, wherein the plurality of sets share the first and second bit line control signal lines.

6. The semiconductor device according to claim 2, wherein
the bit lines included in the first group of bit lines and the bit lines included in the second group of bit lines are arranged one by one alternately;
the selection circuit includes a plurality of column switches provided for the respective bit lines included in each of the first group of bit lines and the second group of bit lines, each column switch being connected to a column selection signal line that controls a switch operation thereof;
each of the first group of bit lines and the second group of bit lines is divided into a plurality of partial bit line groups by dividing the bit lines included in each of the first group of bit lines and the second group of bit lines for every two bit line from one side; and
for each of the plurality of partial bit line groups, the clamp circuit, based on a column selection signal supplied from a column selection signal line connected to a column switch provided to each bit line in a partial bit line group, supplies the reference potential to the partial bit line group, and
wherein a position of a corresponding bit line from the same side is different between the first group of bit lines and the second group of bit lines.

7. The semiconductor device according to claim 6, wherein
the control circuit includes a plurality of signal generation circuits that, for each of the plurality of partial bit line groups, receive a set of column selection signals from column selection signal lines connected to column switches provided to respective bit lines in the partial bit line group, and when all of the column selection signals exhibit a non-selection level, generate an output signal exhibiting an active level; and
the clamp circuit includes a plurality of clamp switches provided for the respective bit lines located in each of the first group of bit lines and the second group of bit lines, the plurality of first clamp switches being connected in common to bit line control signal lines to which output signals from respective corresponding signal generation circuits are supplied, for each partial bit line group.

8. The semiconductor device according to claim 7, comprising a plurality of sets each including the first and second read/write amplifiers, the first group of bit lines, the second group of bit lines, the section circuit and the clamp circuit, wherein the plurality of sets share the bit line control signal lines.

9. A method for a semiconductor device including a first read/write amplifier, a second read/write amplifier, a first group of bit lines belonging to the first read/write amplifier, and a second group of bit lines belonging to the second read/write amplifier and mixed with the first group of bit lines, the method comprising:

designating one of the first group of bit lines to a first selected bit line and remaining ones of the first group of bit lines to first non-selected bit lines;

designating one of the second group of bit lines to a second selected bit line and remaining ones of the second group of bit lines to second non-selected bit lines;

supplying a reference potential to at least one of the first non-selected bit lines, which is adjacent to the first selected bit line, and to at least one of the second non-selected bit lines, which is adjacent to the second selected bit line; and setting at least one of remaining ones of each of the first and second non-selected bit lines into a floating state.

10. The bit line control method according to claim 9, further comprising:

using a plurality of column selection signals to select the first and second selected bit lines; and carrying out a logical operation of the column selection signals to supply the reference potential to the at least one of the first non-selected bit lines, which is adjacent to the first selected bit line, and to the at least one of the second non-selected bit lines, which is adjacent to the second selected bit line, and to set the at least one of remaining ones of each of the first and second non-selected bit lines into the floating state.

11. A semiconductor device comprising:
a plurality of first bit lines;
a plurality of second bit lines mixed with the first bit lines;
a first read/write amplifier;
a second read/write amplifier;
a plurality of first column switches each provided between a corresponding one of the first bit lines and the first read/write amplifier, one of the first column switches being rendered conductive in response to a set of column selection signals to electrically connect an associated one of the first bit lines to the first read/write amplifier as a first selected bit line;
a plurality of second column switches each provided between a corresponding one of the second bit lines and the second read/write amplifier, one of the second column switches being rendered conductive in response to the set of column selection signals to electrically connect an associated one of the second bit lines to the second read/write amplifier as a second selected bit line;
a plurality of bit line control switches each connected between a corresponding one of the first and second bit lines and a reference potential point; and
a logic gate responding to at least one part of the set of column selection signals and rendering a part of the bit line control switches conductive while keeping a remaining part of the bit line control switches nonconductive.

12. The semiconductor device according to claim 11, wherein the plurality of first and second bit lines are arranged alternately.

13. The semiconductor device according to claim 11, wherein the plurality of first and second bit lines are arranged two by two alternately.

14. The semiconductor device according to claim 11, further comprising:

a plurality of word lines respectively intersecting with the first and second bit lines; and a plurality of memory cells arranged at respective intersections of the word lines and the first and second bit lines, wherein each of the memory cells includes an element whose resistance value varies according to stored data.

15. The semiconductor device according to claim 12, further comprising:

a plurality of word lines respectively intersecting with the first and second bit lines; and a plurality of memory cells arranged at respective intersections of the word lines and the first and second bit lines, wherein each of the memory cells includes an element whose resistance value varies according to stored data.

16. The semiconductor device according to claim 13, further comprising:

a plurality of word lines respectively intersecting with the first and second bit lines; and a plurality of memory cells arranged at respective intersections of the word lines and the first and second bit lines, wherein each of the memory cells includes an element whose resistance value varies according to stored data.

17. The device as claimed in claim 11, wherein the part of the bit line control switches comprising one or ones of the bit line control switches which are connected to one or ones of the first bit lines adjacent to the first selected bit line and different one or ones of the bit line control switches which are connected to one or ones of the second selected bit lines adjacent to the second selected bit line.

* * * * *